US009406825B2

(12) United States Patent
Chen

(10) Patent No.: US 9,406,825 B2
(45) Date of Patent: Aug. 2, 2016

(54) STACKED AND INTEGRATED ELECTRIC POWER GENERATING DEVICE CAPTURING MULTIPLE LIGHT SOURCES FOR POWER GENERATION

(71) Applicant: Chia-Lin Chen, Taichung (TW)

(72) Inventor: Chia-Lin Chen, Taichung (TW)

( * ) Notice: Subject to any disclaimer, the term of this patent is extended or adjusted under 35 U.S.C. 154(b) by 0 days.

(21) Appl. No.: 14/720,188

(22) Filed: May 22, 2015

(65) Prior Publication Data

US 2016/0149062 A1 May 26, 2016

(30) Foreign Application Priority Data

Apr. 2, 2014 (TW) ............................ 103112384 A

(51) Int. Cl.

*H01L 31/00* (2006.01)
*H01L 31/043* (2014.01)
*H01L 31/0445* (2014.01)
*H01L 31/054* (2014.01)

(52) U.S. Cl.

CPC .......... *H01L 31/043* (2014.12); *H01L 31/0445* (2014.12); *H01L 31/0543* (2014.12)

(58) Field of Classification Search

CPC .............. H01L 31/043; H01L 31/0445; H01L 31/0543

USPC ................................................ 136/255, 259

See application file for complete search history.

(56) References Cited

U.S. PATENT DOCUMENTS 4,188,238 A * 2/1980 Boling ...................... F21K 2/00 136/247
2005/0150542 A1* 7/2005 Madan ................. H01L 31/043 136/255
2009/0025779 A1* 1/2009 Hsiao ................... H01L 31/043 136/246

* cited by examiner

*Primary Examiner* — Allison Bourke
(74) *Attorney, Agent, or Firm* — Egbert Law Offices, PLLC

(57) ABSTRACT

A stacked and integrated electric power generating device for capturing multiple light sources for power generation has a first concentrating photovoltaic module and a second concentrating photovoltaic module. The first concentrating photovoltaic module 10 has a transparent solar concentrating panel and a thin film solar cell. The second concentrating photovoltaic module is positioned below the first concentrating photovoltaic module with an interval, such that the first and second concentrating photovoltaic modules are in the form of a stacked and integrated structure, and the second concentrating photovoltaic module can absorb the light concentrated by the transparent solar concentrating panel to generate electric power.

5 Claims, 3 Drawing Sheets

A
A
05
10
12 11
20

STACKED AND INTEGRATED ELECTRIC POWER GENERATING DEVICE CAPTURING MULTIPLE LIGHT SOURCES FOR POWER GENERATION

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates generally to an electric power generating device, and more particularly to an innovative design of a stacked and integrated electric power generating device capturing multiple light sources for power generation.

2. Description of Related Art Including Information Disclosed Under 37 CFR 1.97 and 37 CFR 1.98

Due to the prevailing concepts of environmental protection and energy conservation, and in view of the dwindling and depleting oil resources, the development and promotion of green energies are taken as a priority by governments around the world, and it is planned to replace traditional energies with green energies. So-called green energies include solar power, water power, wind power etc, among which solar power is believed to be more convenient and environment-friendly. Therefore, nowadays there are vigorous technological developments to use solar power for electric power generation.

In the principle of traditional solar power generation, a solar panel is exposed to sunlight to absorb solar power, a semi-conductor is used to generate electrons (i.e. the cathode) and electron holes (i.e., the anode), and the electrons and electron holes are separated to cause a voltage drop, so as to convert solar power into electric power. However, although the conventional solar panel structure has been in application for many years and it can meet the need for electric power generation, in actual application, for a fixed generating capacity, usually an array of multiple solar panels are distributed to absorb more sunlight for higher power generation efficiency. As a result, the total installation has a very large size and occupies a lot of space. The installation cost is also very high. Meanwhile, with one solar panel alone, its power generation efficiency can hardly meet practical demands.

Thus, to overcome the aforementioned problems of the prior art, it would be an advancement in the art to provide an improved structure that can significantly improve the efficacy.

Therefore, the inventor has provided the present invention of practicability after deliberate design and evaluation based on years of experience in the production, development and design of related products.

BRIEF SUMMARY OF THE INVENTION

The present invention discloses "a stacked and integrated electric power generating device capturing multiple light sources for power generation". Through an innovative structure in which the first and second concentrating photovoltaic modules absorb different spectral bands that are not completely overlapped, the present invention surpasses the prior art with one single electric power generating device to substantially enhance power generation efficiency and conversion quantum efficiency, and meanwhile reduce the cost of power generation. On the other hand, the present invention can effectively reduce the installation size and installation cost of the electric power generating device, and meanwhile can increase the available space around for utilization. Therefore, compared to the prior-art structure with an array of multiple solar panels to absorb light sources, the present invention can substantially reduce the installation size and installation cost of the electric power generating device through a multiple light sources capturing structure, and can substantially enhance power generation efficiency and conversion quantum efficiency. All these are practical benefits for industrial utilization.

Although the invention has been explained in relation to its preferred embodiment, it is to be understood that many other possible modifications and variations can be made without departing from the spirit and scope of the invention as hereinafter claimed.

DETAILED DESCRIPTION OF THE INVENTION

Figure 1:
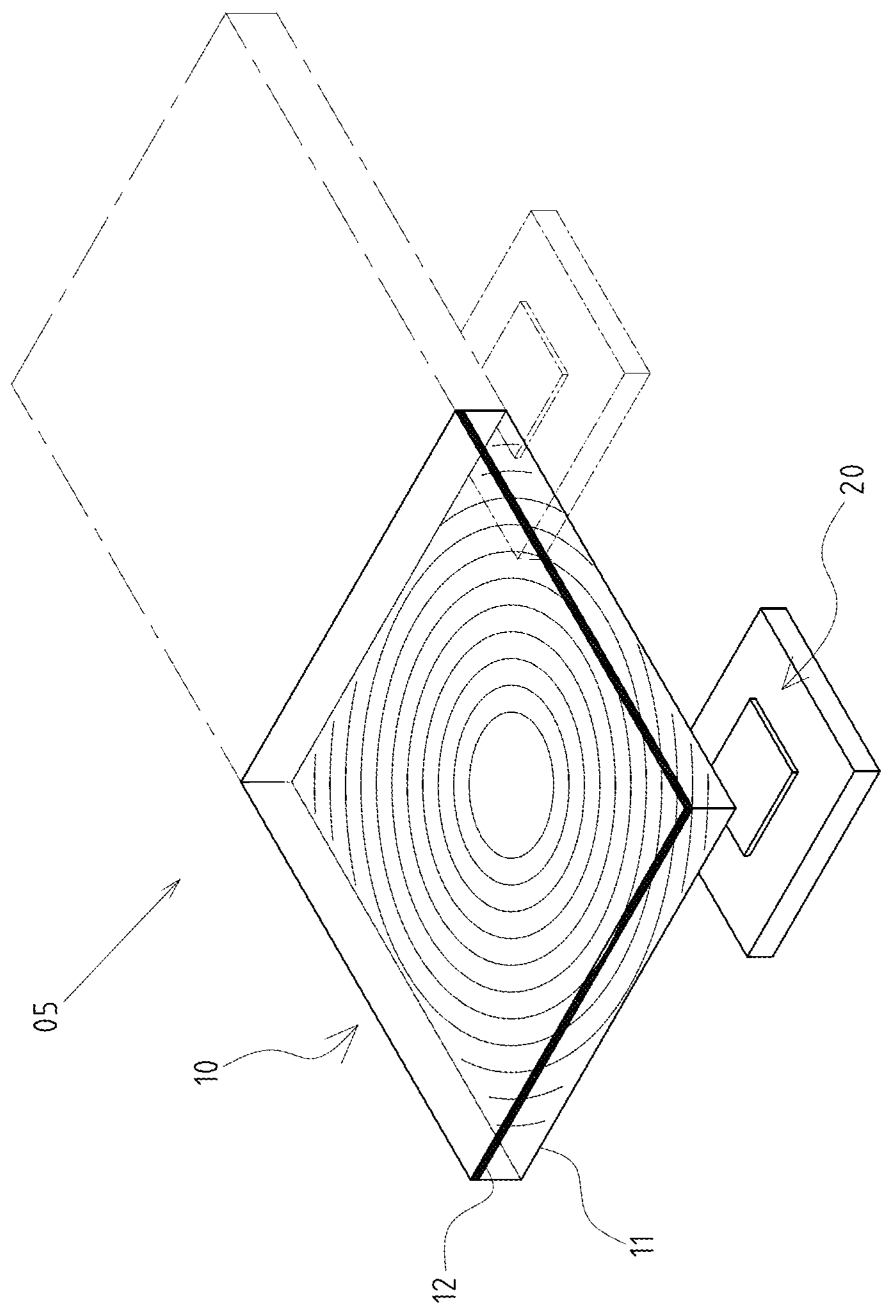
FIG. 1 is a perspective view of the structure of the present invention.
Figure 2:
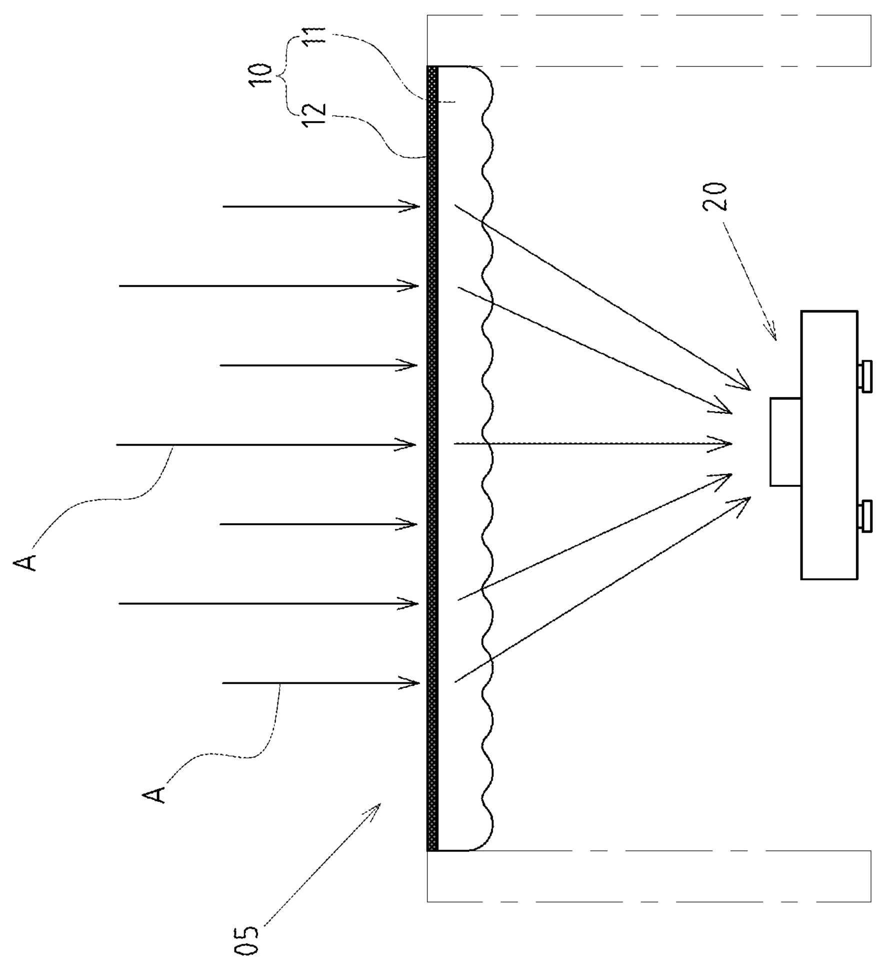
FIG. 2 is a working state view of the present invention.
Figure 3:
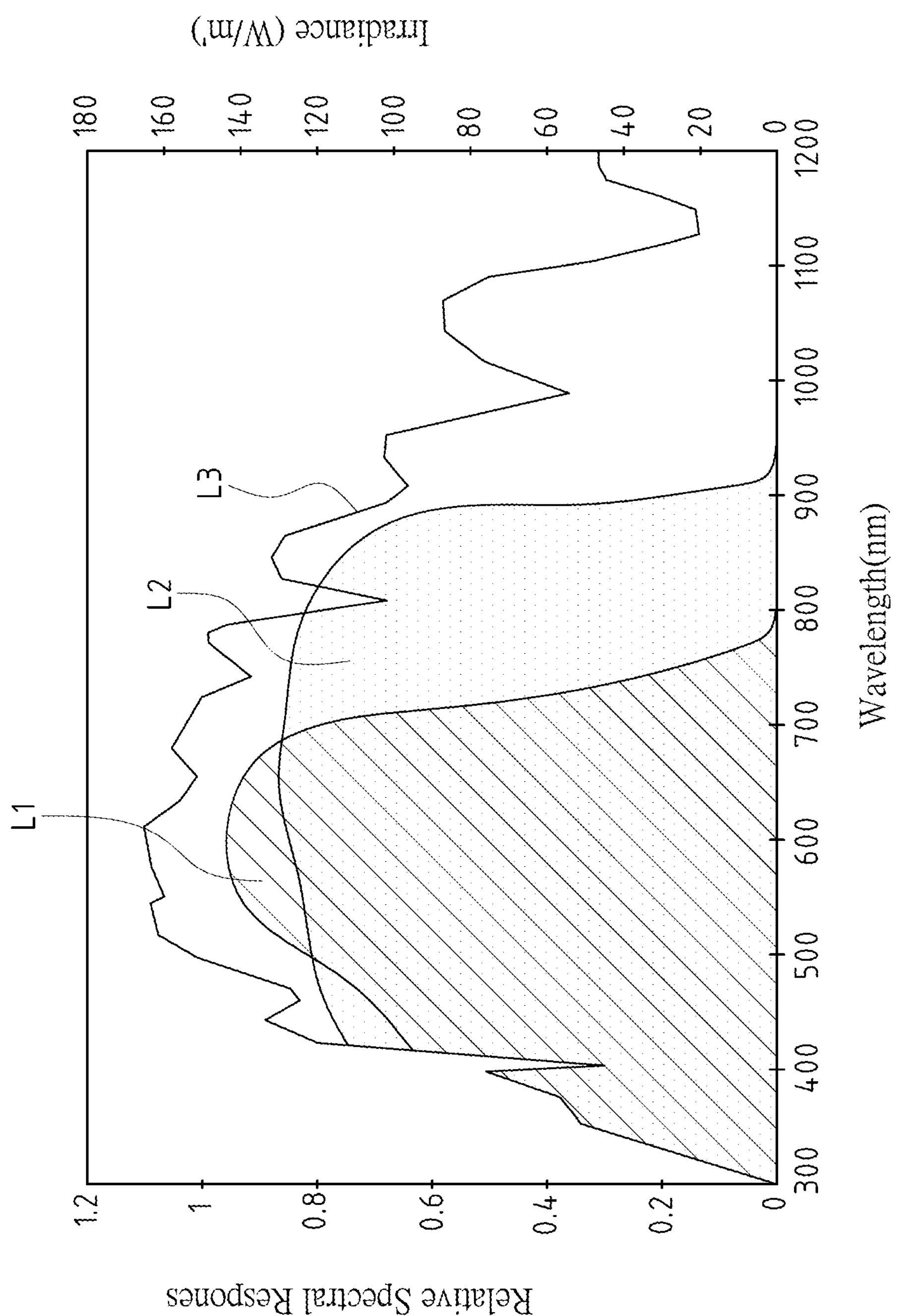
FIG. 3 is a linear view of the different spectral regions to be absorbed by the first and second concentrating photovoltaic modules of the present invention.

FIG. 1 to 3 depict a preferred embodiment of the present invention of a stacked and integrated electric power generating device capturing multiple light sources for power generation. While such an embodiment is for description purpose only, it is not intending to limit the patent claims. Said electric power generating device 05 comprises:

- a first concentrating photovoltaic module 10, said first concentrating photovoltaic module 10 at least including a transparent solar concentrating panel 11 and a thin film solar cell 12 configured on the transparent solar concentrating panel 11 in a transparent style, and said thin film solar cell 12 able to absorb predetermined optical spectrum bands of the light source for electric power generation, and to allow the light source to go through the thin film solar cell 12 (as marked in FIG. 2 with Arrow A) and to cause a downward light source beam concentration effect through the transparent solar concentrating panel 11; said transparent solar concentrating panel 11 can be implemented in the form of a Fresnel lens, so as to cause a beam concentrating effect when the light passes, and said thin film solar cell 12 can be in the form of an amorphous silicon thin film solar cell;
- a second concentrating photovoltaic module 20, configured below the first concentrating photovoltaic module 10 with an interval, such that the first and second concentrating photovoltaic modules 10, 20 are in the form of a stacked and integrated structure, and the second concentrating photovoltaic module 20 can absorb the light concentrated by the transparent solar concentrating panel 11 to generate electric power;

particularly, the spectrum bands absorbed by the second concentrating photovoltaic module 20 must not completely overlap with the spectrum bands absorbed by the first concentrating photovoltaic module 10 (see FIG. 3, Arrow L1 represents the spectral region to be absorbed by the first concentrating photovoltaic module 10, Arrow L2 represents the spectral region to be absorbed by the second concentrating photovoltaic module 20, Arrow L3 shows the curve of luminous energies of the light source in different wave lengths), such that the first and second concentrating photovoltaic modules 10, 20 can absorb different regions of the optical spectrum, and that the capture of multiple light sources can enhance the power generation efficiency; said second concentrating photovoltaic module 20 can be implemented as a single chipset in any type of gallium arsenide, copper indium gallium diselenide, or cadmium telluride (without limitation, any other types like copper indium diselenide can be adopted by the present invention), or as multiple chipsets constructed through combination or lamination of any of the above gallium arsenide, copper indium gallium diselenide, or cadmium telluride, for example, the top layer is gallium arsenide, and the bottom layer is copper indium gallium diselenide. Moreover, when the second concentrating photovoltaic module 20 is a multilayer chipset, the different layers can absorb different regions of the optical spectrum, such that the lower layers can further absorb different regions of the optical spectrum of the light transmitted from the upper layers. In this way, the multiple light sources capturing effect and power generation efficiency can be further enhanced.

By adopting the above structure, with just one electric power generating device 05, the power generation efficiency and conversion QE (Quantum Efficiency) can be substantially enhanced, and the cost of power generation can be reduced. Comparing to the conventional structure to distribute an array of multiple solar panels to absorb light sources, the present invention can realize the same power generation capacity without the need for an array of multiple solar panels, and can therefore effectively reduce the installation size of the electric power generating device 05 as well as the installation cost, and can meanwhile increase the available space around for utilization. Hence, it provides convenience and practicability in application. To conclude, through a multiple light sources capturing structure, the present invention can substantially enhance power generation efficiency and meanwhile reduce the cost of power generation, size of installation as well as cost of installation. All these are practical benefits for industrial utilization.

Referring to FIG. 1, the electric power generating device 05 disclosed in the present invention can be configured as a single chipset or any type of multiple chipsets. Any type of configuration can be adopted according to application requirements.

In addition, the thin film solar cell 12 on the first concentrating photovoltaic module 10 can be configured on the transparent solar concentrating panel 11 through any method of sputtering, chemical vapor deposition, coating or lamination with no limitation.

I claim:

1. A stacked and integrated electric power generating device for power generation, comprising:

a first concentrating photovoltaic module, said first concentrating photovoltaic module at least including a transparent solar concentrating panel and a thin film solar cell configured on the transparent solar concentrating panel in a transparent style, and said thin film solar cell able to absorb a first portion of light from a light source for electric power generation, and to allow a second portion of light from the light source to go through the thin film solar cell and pass to the transparent solar concentrating panel and cause the second portion of light to be concentrated by the transparent solar concentrating panel;

a second photovoltaic module, configured below the first concentrating photovoltaic module with an interval, such that the first concentrating and second photovoltaic modules are in the form of a stacked and integrated structure, and the second concentrating photovoltaic module can absorb the second portion of light concentrated by the transparent solar concentrating panel to generate electric power;

particularly, the spectrum bands of the second portion of the light absorbed by the second photovoltaic module must not completely overlap with the spectrum bands of the first portion of the light absorbed by the first concentrating photovoltaic module, such that the first concentrating and second photovoltaic modules can absorb different regions of the optical spectrum.

2. The device defined in claim 1, wherein the transparent solar concentrating panel on the first concentrating photovoltaic module is a Fresnel lens, and the thin film solar cell is an amorphous silicon thin film solar cell.

3. The device defined in claim 1, wherein said second concentrating photovoltaic module is in the form of a single chipset in any type of gallium arsenide, copper indium gallium diselenide, cadmium telluride, or of multiple chipsets constructed through combination or lamination of any of gallium arsenide, copper indium gallium diselenide, or cadmium telluride.

4. The device defined in claim 3, wherein said electric power generating device is configured as any of one single chipset or at least a plurality of chipsets.

5. The device defined in claim 1, wherein the thin film solar cell is configured on the transparent solar concentrating panel through any method of sputtering, chemical vapor deposition, coating or lamination.

* * * * *